(12) United States Patent
Bendix et al.

(10) Patent No.: US 10,420,239 B2
(45) Date of Patent: *Sep. 17, 2019

(54) CONTROL OF ELECTRIC FIELD EFFECTS IN A PRINTED CIRCUIT BOARD ASSEMBLY USING EMBEDDED NICKEL-METAL COMPOSITE MATERIALS

(71) Applicant: Sparton Corporation, Schaumburg, IL (US)

(72) Inventors: Lendon L. Bendix, Deland, FL (US); Derek Turner, Winter Park, FL (US)

(73) Assignee: Sparton Corporation, Schaumburg, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/047,102

(22) Filed: Jul. 27, 2018

(65) Prior Publication Data

US 2018/0338382 A1    Nov. 22, 2018

Related U.S. Application Data

(60) Division of application No. 15/203,206, filed on Jul. 6, 2016, now Pat. No. 10,070,547, which is a continuation-in-part of application No. 14/190,627, filed on Feb. 26, 2014.

(51) Int. Cl.
*H05K 5/06* (2006.01)
*H05K 1/02* (2006.01)

(52) U.S. Cl.
CPC .......... *H05K 5/065* (2013.01); *H05K 1/0218* (2013.01); *H05K 2201/0723* (2013.01)

(58) Field of Classification Search
CPC ............... H05K 5/065; H05K 1/0218; H05K 2201/0723

See application file for complete search history.

(56) References Cited

U.S. PATENT DOCUMENTS

| | | | | |
|---|---|---|---|---|
| 3,737,997 A | * | 6/1973 | Davis ...................... | H01B 7/16 156/49 |
| 3,774,013 A | * | 11/1973 | Keep, Jr. .................. | H05B 3/58 174/113 R |
| 4,514,586 A | * | 4/1985 | Waggoner ............ | H05K 9/0088 174/386 |

(Continued)

*Primary Examiner* — David M Sinclair
*Assistant Examiner* — Theron S Milliser
(74) *Attorney, Agent, or Firm* — Quinn IP Law

(57) ABSTRACT

A printed circuit board assembly (PCBA) controls an electrically-initiated device (EID) in an electric field. The PCBA includes a conductive layer, a dielectric layer, and a transconductive layer (TCL). The conductive layer of the PCBA designated protected areas. An electrical current with a predetermined current density is impressed in the conductive layer when the PCBA is in the electric field. The TCL is a nickel-metal composite metamaterial positioned between the conductive and dielectric layers and configured to change in shape or thickness in the electric field such that the impressed current is steered away from the conductive layer and into the dielectric layer to prevent premature activation of the EID. A system includes an outer housing, power supply, an EID such as a sonobuoy or medical device, and the PCBA, all of which are encapsulated in the housing. A method is also disclosed for manufacturing the PCBA.

20 Claims, 1 Drawing Sheet

(56) References Cited

U.S. PATENT DOCUMENTS

| | | | | |
|---|---|---|---|---|
| 4,581,109 A * | 4/1986 | Goor | ........................ | C25D 5/12 205/176 |
| 4,619,872 A * | 10/1986 | Goor | ........................ | C25D 5/12 428/632 |
| 4,647,714 A * | 3/1987 | Goto | ........................ | B32B 15/04 174/36 |
| 4,673,363 A * | 6/1987 | Hudson | ................... | B29C 49/20 264/516 |
| 4,822,698 A * | 4/1989 | Jackovitz | ................ | H01M 4/46 429/118 |
| 5,119,341 A * | 6/1992 | Youngberg | ........... | G01S 5/0009 367/5 |
| 5,166,845 A * | 11/1992 | Thompson | .............. | G11B 5/484 360/123.05 |
| 5,395,707 A * | 3/1995 | McCarter | ................ | H01M 6/34 429/119 |
| 5,435,903 A * | 7/1995 | Oda | ....................... | H05K 3/244 205/258 |
| 5,442,358 A * | 8/1995 | Keeler | ..................... | B63G 7/00 342/54 |
| 5,804,882 A * | 9/1998 | Tsukagoshi | ....... | H01L 23/49838 257/783 |
| 6,507,100 B1 * | 1/2003 | Valluri | .............. | H01L 23/49838 257/691 |
| 6,534,852 B1 * | 3/2003 | Lin | ..................... | H01L 23/3128 257/690 |
| 6,584,045 B1 * | 6/2003 | Ishii | .................. | G11B 11/10534 369/13.17 |
| 6,693,357 B1 * | 2/2004 | Borst | .................. | H01L 21/31053 257/762 |
| 8,939,056 B1 * | 1/2015 | Neal, III | ................. | F42B 15/22 89/1.51 |
| 2001/0033478 A1 * | 10/2001 | Ortiz | .................. | H01R 13/6599 361/818 |
| 2001/0037896 A1 * | 11/2001 | Asai | ................. | H01L 23/49816 174/255 |
| 2002/0043715 A1 * | 4/2002 | Takizawa | .............. | H01L 23/528 257/700 |
| 2003/0047338 A1 * | 3/2003 | Okayama | ............... | H01Q 17/00 174/391 |
| 2003/0107025 A1 * | 6/2003 | Okayama | ................ | B82Y 25/00 252/500 |
| 2003/0230791 A1 * | 12/2003 | Tsuk | ....................... | H01L 23/50 257/665 |
| 2004/0084205 A1 * | 5/2004 | Chang | ............... | H01L 23/49822 174/250 |
| 2007/0001285 A1 * | 1/2007 | Takiar | ................. | H01L 23/3121 257/700 |
| 2007/0004094 A1 * | 1/2007 | Takiar | ............... | H01L 23/49838 438/125 |
| 2007/0004097 A1 * | 1/2007 | Yu | ..................... | H01L 23/49811 438/129 |
| 2007/0102192 A1 * | 5/2007 | Naito | .................... | H05K 9/0096 174/389 |
| 2007/0196671 A1 * | 8/2007 | Kobayashi | ............. | B82Y 25/00 428/447 |
| 2008/0007927 A1 * | 1/2008 | Ito | ..................... | H01L 23/49822 361/764 |
| 2008/0236873 A1 * | 10/2008 | Kuwajima | ............. | H01C 1/148 174/257 |
| 2008/0245563 A1 * | 10/2008 | Naito | ........................ | B32B 7/02 174/392 |
| 2009/0107714 A1 * | 4/2009 | Ogasawara | .......... | H05K 1/0271 174/260 |
| 2009/0188703 A1 * | 7/2009 | Ito | ..................... | H01L 23/49838 174/255 |
| 2009/0243756 A1 * | 10/2009 | Stevenson | ............ | A61N 1/3754 333/172 |
| 2010/0096181 A1 * | 4/2010 | Nakamura | ................ | B32B 7/02 174/394 |
| 2011/0031008 A1 * | 2/2011 | Kagawa | .................... | B32B 3/30 174/377 |
| 2011/0048789 A1 * | 3/2011 | Kuwajima | .......... | H01L 23/3192 174/262 |
| 2011/0268925 A1 * | 11/2011 | Kagawa | ............... | H05K 9/0086 428/167 |
| 2013/0264511 A1 * | 10/2013 | Choi | .................... | H05K 9/0083 252/62.54 |
| 2014/0154469 A1 * | 6/2014 | Kagawa | ............... | H05K 9/0088 428/155 |
| 2015/0070236 A1 * | 3/2015 | Walters | .................. | H01Q 1/526 343/841 |

* cited by examiner

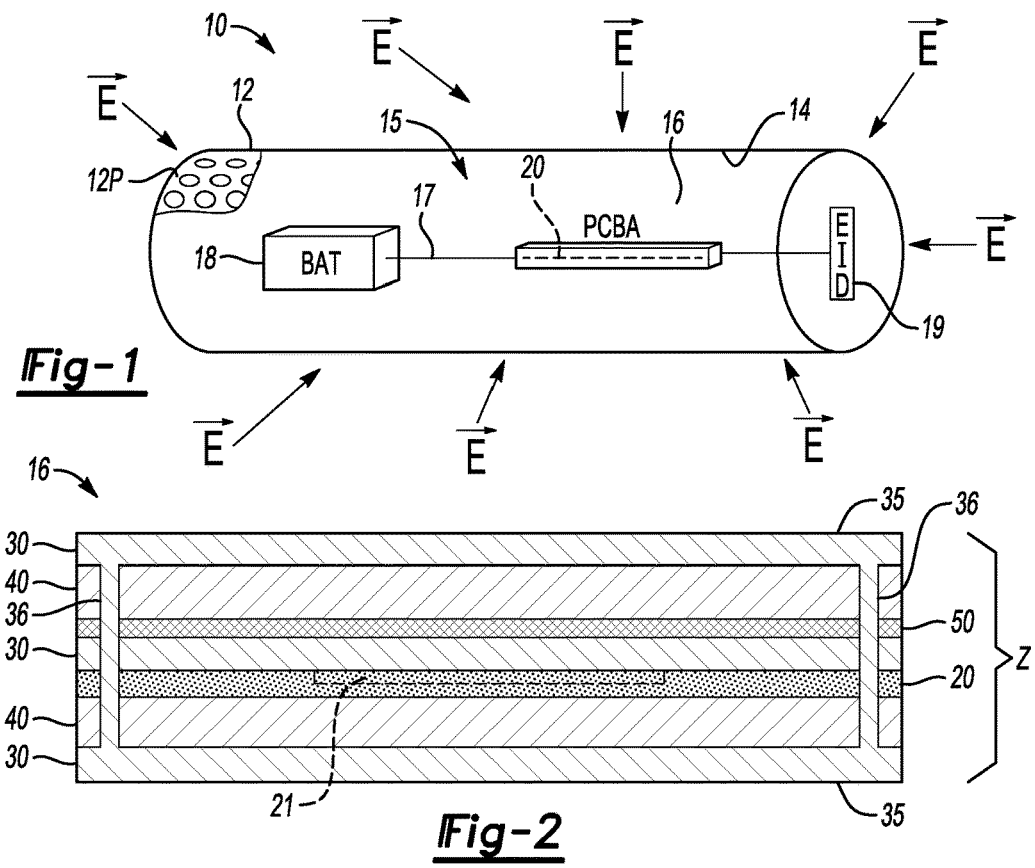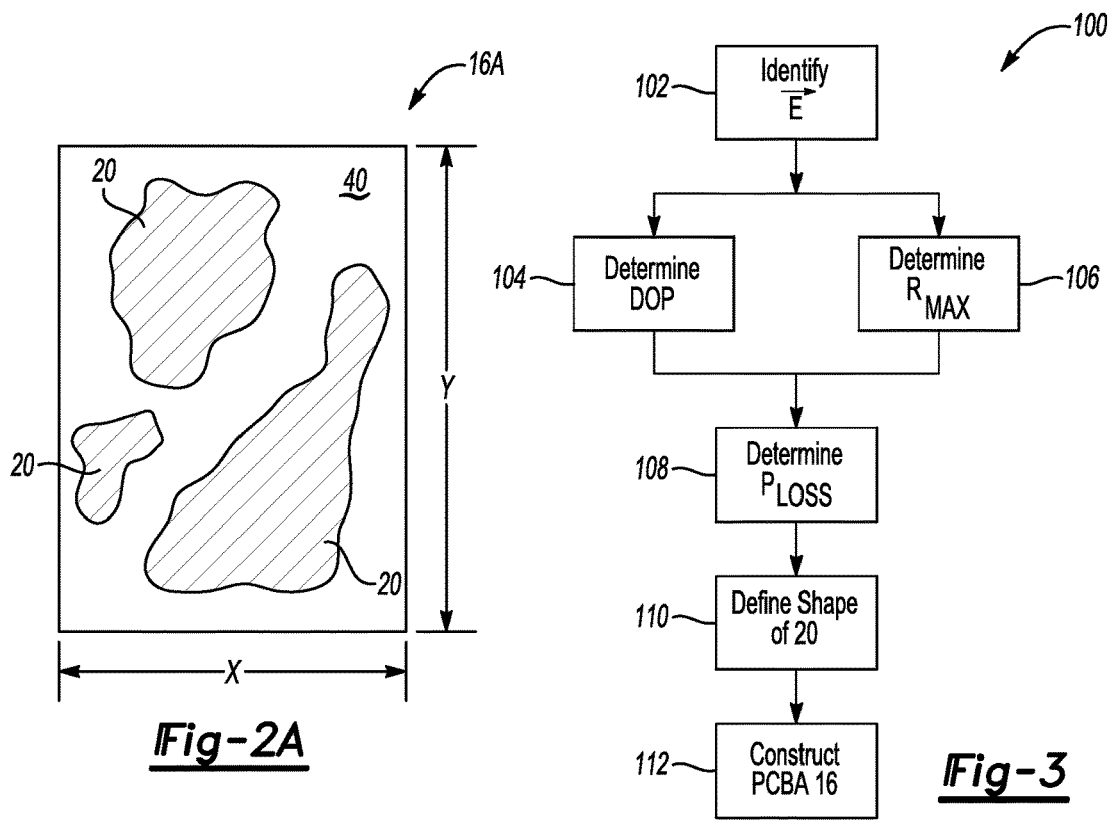

US 10,420,239 B2

CONTROL OF ELECTRIC FIELD EFFECTS IN A PRINTED CIRCUIT BOARD ASSEMBLY USING EMBEDDED NICKEL-METAL COMPOSITE MATERIALS

CLAIM OF PRIORITY AND CROSS-REFERENCE TO RELATED APPLICATIONS

This application is a divisional of U.S. patent application Ser. No. 15/203,206, which was filed on Jul. 6, 2016, is now allowed, and is a continuation-in-part of U.S. patent application Ser. No. 14/190,627, which was filed on Feb. 26, 2014, both of which are incorporated herein by reference in their respective entireties and for all purposes.

TECHNICAL FIELD

The present disclosure relates to the control of electric field effects in a printed circuit board assembly using embedded nickel-metal composite materials.

BACKGROUND

Silicon and other semiconductor materials are used to construct printed circuit board assemblies (PCBAs) for use in the control of electronic circuits and other devices. In a typical PCBA, conductors and circuit components, such as capacitors, resistors, diodes, and the like, may be surface mounted or etched onto the PCBA. The PCBA supports as well as electrically interconnects the various components and traces using thin sheets of conductive foil interposed between dielectric layers.

PCBAs, being electric circuits, tend to be highly sensitive to the effects of radiation. Therefore, a common board-level design feature is a Faraday cage. Faraday cages are metal enclosures that are typically surface mounted to the PCBA between sensitive circuit components and the source of radiation. Such cages form electromagnetic interference (EMI) shields around the protected components, and operate by reflecting radiation energy and/or dissipating the energy as heat. Faraday cages may be fastened to an outer surface of the PCBA, or may be located within the board, e.g., as a multi-sided shield protecting PCBA components from internally-generated narrowband fields emanating from adjacent PCBA components. However, Faraday shields and other EMI shielding techniques may not be appropriate in certain applications due to their size and weight, as well as the band-limited nature of their shielding-based principle of operation.

Specifically, Faraday cages and other prior art EMI shields can be relatively large and bulky relative to the components that are being protected. As a result, physical EMI shields typically add an undesirable height or Z-dimension that may be less than optimal or even impracticable for certain applications, particularly those encapsulated in a housing having limited internal space. Additionally, incident field energy may be impinged within any cavities that might exist between the EMI shield and the protected components of the PCBA, thereby leading to undesirable cavity effects. For instance, trapped energy within such cavities may resonate and cause cavity energy to grow exponentially, ultimately damaging the PCBA. Thus, Faraday cages may be undesirable in certain sensitive applications.

Electrically-initiated devices (EIDs) are a particular class of sensitive devices that are triggered or activated via an electrical signal, often while being exposed to intense electric fields. An example EID application is that of an incendiary device used to create a flame or intense heat, e.g., in a sonobuoy operation. For instance, the incendiary device could burn through a small line or lanyard that is maintaining a carbon dioxide ($CO_2$)-based activation function in an off state, with severing of the lanyard causing release of stored $CO_2$. The released $CO_2$ rapidly inflates a sonobuoy floatation device, or alternatively deflates such a flotation device so as to scuttle the sonobuoy when sonobuoy operations are complete. Other EID applications may include pace makers and other medical devices which trigger in response to an electrical signal. As a result, there is a need to protect against premature activation of EIDs due to energy from an incident electric field.

SUMMARY

A printed circuit board assembly (PCBA) and an associated system are disclosed herein. In systems employing the PCBA in the control of an externally-positioned EID of the type described above, impressed electrical currents from the incident electric field could result in an inadvertent or premature activation of the EID. It is therefore a goal of the present disclosure to solve this particular problem.

Unlike conventional EMI shielding approaches, the present disclosure proposes to embed one or more trans-conductor layers (TCLs) constructed of nickel-metal composite materials within the layers or traces of the PCBA. The TCL acts a filter of broadband direct-radiated radio frequency (RF) and complex resonant electrical fields resulting from such broadband RF fields. The TCL materials, which are provided with a variable geometry, i.e., geometric shape, with respect to the PCBA's length, width, and/or height, absorb the incident energy in a particular bandwidth and also prevent dissipation of this absorbed energy to specific designated "protected" portions of the PCBA. The diverted energy dissipates in two ways: as heat via thermal conductance within the PCBA, and via reactance, i.e., by dissipation of the energy into the surrounding dielectric material. Thus, the TCL acts as a passive element by changing its characteristic impedance in response to an incident broadband electromagnetic field.

In an example embodiment, a PCBA is disclosed for control of an EID in an incident broadband electric field, with the EID being external to the PCBA. The PCBA includes a conductive layer, a dielectric layer, and a trans-conductor later. An electrical current with a predetermined current density is impressed by the broadband electric field in the conductive layer, which is electrically connected to the EID.

The TCL is constructed of a nickel-metal composite metamaterial and is positioned adjacent to the conductive and dielectric layers. The TCL is configured to change in shape or thickness in the presence of the broadband electric field such that the impressed current is steered or guided away from the conductive layer and into the dielectric layer to thereby prevent premature activation of the EID.

The TCL may be constructed partially of nickel-phosphorus (NiP) in an example embodiment. Nickel-chromium (NiCr) may be used in another embodiment. Other materials may be conceived of within the intended scope of this disclosure, with the properties of nickel being particularly useful for achieving the desired ends. The nickel content of the TCL may range from about 10% -45% by total weight of the TCL for optimal results, with the significance of this range explained further herein. The nickel content of the TCL responds to the incident electric field as the nickel compresses. Thus, changes occurring to the surface roughness and internal complex impedance of the PCBA with increasing field intensity are used to great advantage by steering energy from the broadband incident electric field away from the EID.

An associated system is also disclosed herein. The system includes an outer housing, a power supply, an EID, and the PCBA. The power supply, the EID, and the PCBA are all encapsulated and collocated within the outer housing, with the EID and the PCBA being electrically connected to the power supply, e.g., a DC battery. The design of the PCBA prevents an unintended activation of the EID due to the electric field and the flow of current at the predetermined current density in the conductive layer.

A method is also disclosed herein for manufacturing a PCBA for control of an EID in an incident broadband electric field. The EID is positioned externally with respect to the PCBA. In a representative embodiment, the method includes identifying characteristics of the electric field, and identifying protected areas of a conductive layer within the PCBA that are electrically connected to the EID. Additionally, the method includes determining a depth of penetration of the electric field into the protected areas, as well as determining a thickness and shape of a trans-conductor layer (TCL) constructed of a nickel-metal composite metamaterial and configured to change shape in the presence of the electric field. As part of the latter step, the method includes evaluating the depth of penetration, power loss in the PCBA, and a density of the impressed current. The TCL with the determined thickness and shape adjacent is then positioned adjacent to the protected areas of the conductive layer.

The above summary is not intended to represent every embodiment or every aspect of the present disclosure. Rather, the foregoing summary merely provides an exemplification of some of the novel aspects and features set forth herein. The above features and advantages, and other features and advantages of the present disclosure, will be apparent from the following detailed description of representative embodiments and modes for carrying out the disclosure when taken in connection with the accompanying drawings and appended claims. Moreover, this disclosure expressly includes any and all combinations and subcombinations of the elements and features presented herein.

BRIEF DESCRIPTION OF THE DRAWINGS

FIG. 1 is a schematic perspective-view illustration of an example system having a printed circuit board assembly (PCBA) contained therein, with the PCBA constructed with embedded nickel-metal trans-conductor layers as set forth herein.

FIG. 2 is schematic cross-sectional view of a PCBA usable within the system shown in FIG. 1.

FIG. 2A is a schematic plan view illustration of a portion of the PCBA of FIG. 2 in a possible embodiment.

FIG. 3 is a flow chart describing a method of constructing the PCBA shown in FIG. 1.

DETAILED DESCRIPTION

Referring to the drawings, wherein like reference numbers correspond to like or similar components throughout the several figures, a system 10 is shown schematically in FIG. 1. The system 10 includes an outer housing 12 having a wall 14 that defines an internal cavity 15. While shown as an example cylinder, e.g., the shape typically assumed by the outer housing 12 when used in an example sonobuoy application, with the outer housing 12 being perforated or porous, as indicated generally at 12P in FIG. 1, in sonobuoy applications as noted above, the actual shape of the outer housing 12 may be expected to differ with the design. For instance, as an alternative to being configured as a sonobuoy system, the system 10 may be alternatively embodied as a medical device, such as a pacemaker, and thus may have a rectangular or an irregular shape in other embodiments. Other geometric shapes may be envisioned without departing from the intended inventive scope.

A printed circuit board assembly (PCBA) 16 is encapsulated within the cavity 15, along with other possible components such as a power supply 18 such as a DC battery (BAT) and an electrically-activated device (EID) 19, both of which may be collocated with the PCBA 16 as shown, i.e., external to the PCBA 16 in proximity thereto as shown in FIG. 1. The PCBA 16 and the EID 19 are electrically connected to the power supply 18 via a conductor 17, for instance a length of wire. Example applications of the EIDs 19 may include deployment of a sonobuoy and activation of a pacemaker or other medical device as noted above.

A sonobuoy may be a submarine, air, or surface-launched device used to detect acoustic emissions or reflections in a body of water, and to transmit the detected signals to a remote source for processing. A sonobuoy may employ acoustic sensors that aid in the detection, classification, and localization of targets in the body of water via determination of sonar propagation properties and acoustic range prediction. Thus, the EID 19 of FIG. 1 could be used as part of a launch device or other controlled component of such a sonobuoy. Example medical device applications that may embody the EID 19 of FIG. 1 include those used in critical care systems such as pacemakers, defibrillators, neurostimulator devices, and robotic surgical tools. While sonobuoy and medical devices are examples of systems 10 that may benefit from the design of the PCBA 16 disclosed herein, the system 10 is not intended to be limited to such devices.

In general, the PCBA 16 of FIG. 1 may be constructed using, for instance, surface and/or bulk micromachining techniques such as chemical vapor deposition, etching, and/or other suitable processes, as is well understood in the art. The PCBA 16, the internal structure of which is described in further detail below with reference to FIG. 2, is a multi-layered circuit board. The various layers may be laminated together via pressure and heat to form the PCBA 16 as an integral piece. The PCBA 16 is characterized by an absence of a Faraday cage or other EMI shielding structure, as shown in the various Figures and noted above, with the TCL 20 replacing such shielding structure to a different effect.

Instead, the PCBA 16 in all embodiments includes an embedded trans-conductor layer (TCL) 20. As explained in detail below, the TCL 20 is an embedded layer of a nickel-metal composite metamaterial, i.e., artificial materials that are structured on a size scale that is smaller than the wavelength of external stimuli, e.g., nanomaterials. Such materials may exhibit properties that are not typically found in nature. One such property used herein is the tendency to compress in the presence of energy from an externally-generated electric field, which is represented schematically in FIG. 1 by arrows $\vec{E}$. The geometry of the TCL 20 may also vary with respect to at least one of the three primary dimensions of the PCBA 16, i.e., length, width, and height. That is, TCL 20 could be thicker, wider, or longer in certain locations relative to others.

The TCL 20 as described herein is configured to act as a filter or waveguide of broad-band energy from the externally-generated electric field $\vec{E}$. The ability to change in shape or thickness in the presence of the electric field $\vec{E}$ allows an impressed current in the conductive layer 30 to be steered or guided away from the conductive layer 30 and into the dielectric layer 40 to thereby prevent premature activation of the EID 19. As used herein, the term "broadband" refers to a sufficiently wide range of radio frequency (RF) energy, e.g., 2 MHz-20 GHz in an example embodiment, and any complex resonant fields associated with this incident energy. It is recognized herein that the electric field $\vec{E}$ may induce a current with a current density J in the PCBA 16. The term "current density" refers to the electric current (I) per unit area (A) of cross section. The magnitude of the current density J, as measured in amperes/m², may be given as:

$$J = \lim_{A \to 0} \frac{I}{A}$$

In particular, the TCL 20 may be shaped, sized, and positioned, i.e., configured, to direct undesirable energy from the electric field $\vec{E}$ through the PCBA 16 without penetrating into an any conductive layers. The TCL 20 is embedded in the PCBA 16 itself, and thus unlike Faraday cages and other EMI shielding designs does not cover the PCBA 16, i.e., the TCL 20 is not positioned between an uppermost surface 35 of the PCBA 16 and the incident electric field $\vec{E}$. Likewise, the TCL 20 does not reflect energy away from the PCBA 16 like a Faraday shield, and also does not suffer from the same Z-dimensional packaging issues of such shields.

A key element of the present disclosure is the use of nickel in the TCL 20 in a particular manner, which is to control the undesirable effects of the electric field $\vec{E}$. The TCL 20, due to its nickel content, is configured to contract or otherwise change shape or deform in the presence of the electric field $\vec{E}$, which in turn allows the TCL 20 to be formed with a variable geometry and thus control the effects of the electric field $\vec{E}$ on the performance of the PCBA 16. The particular design of the TCL 20 is both field and application specific. A general approach for achieving the desired end results via the TCL 20 is described below with reference to FIG. 3.

Specifically, the TCL 20 is configured to reduce or eliminate the effects of high-intensity radiated broadband fields, including peak fields as high as 5000 volts per meter with vertical and horizontal polarization. Energy from the incident electric field $\vec{E}$ is guided away from the EID 19 by passively controlling the internal complex impedance of the PCBA 16. The same electric field $\vec{E}$ falls incident upon the PCBA 16 sets up an immediate electric field vector potential from a top side to a bottom side of the PCBA 16, with "top" referring to the surface of the PCBA 16 facing the incident electric field $\vec{E}$.

The true transverse electric field established by the electric field vector potential will change characteristics of the nickel-metal composite materials of the TCL 20, including a change in shape and/or thickness of the TCL 20, thereby changing the impedance of the PCBA 16. As will be appreciated by one of ordinary skill in the art, the impressed current will follow a path of least resistance away, which in the present construction is away from the conductive layer 30 or any protected areas in or on such a layer 30. In particular, the characteristic impedance of the nickel-metal composite materials changes by physically changing the natural surface roughness and physical size and/or shape of the nickel-metal composite materials of the TCL 20 throughout the PCBA 16. Such a change is caused by the high intensity of the magnetic field associated with the predefined polarization of the illuminating spherical electric field.

As the impressed currents will tend to flow in the path of least resistance, such currents can be steered through the PCBA 16 using the TCL 20, and ultimately dissipated into the dielectric layers 40 shown in FIG. 2. Thus, characteristics of the TCL 20 can be chosen to provide a desired response to the electric field $\vec{E}$ the EID 19 is expected to operate in, once again without EMI shielding of the PCBA 16. The dielectric material for the layers 40 is selected to create a dielectric waveguide which redirects unwanted field energy to the ends of the PCBA 16, e.g., into vias 36 (FIG. 2) or other structure. Such vias 36 then radiate trapped energy away from the EID 19 as dispersed, lower intensity fields. Therefore, directing the impressed currents into the dielectric layers 40 allows for amplitude and phase variations of impressed currents to effectively cancel each other out. The phase mismatch created by the different magnitudes and angles at which energy from the incident field $\vec{E}$ is impressed onto the TCL 20 eliminates the need for EMI shield material, with operation of the EID 19 possible in incident electric fields $\vec{E}$ of at least 2600 volts per meter.

As used herein, the term "nickel-metal composite" refers to any alloy of nickel, with nickel phosphorus (NiP) and nickel chromium (NiCr) being two possible embodiments exhibiting desirable properties and control results. NiP, for instance, is highly resistive, and in a field such as the electric field $\vec{E}$, exhibits a measurable frequency response. This response can be employed to the desired effect as explained below. An alloy having an excessive amount of nickel, however, tends to behave too much like a conductor, and therefore the percentage of nickel by weight should be limited. An example range that achieves the desired effect is 10-45% of nickel by weight of the TCL 20.

Additionally, the TCL 20 exhibits capacitance due in part to its surface roughness. For this reason, the TCL acts a transmission line, and for this reason is referred to herein as a Trans-Conductor Layer or TCL. In acting like a transmission line, the TCL 20 is able to reduce EMI effects from the externally-generated electric field $\vec{E}$ via embedding of nickel-based metamaterials in a purposeful, design-specific manner. The TCL 20 guides unwanted current density flow away from any adjacent conductive layers 30 or other predetermined sensitive protected areas of the PCBA 16, with energy dissipated away from such areas via thermal conductance and reactance. In this manner, the internal traces of the PCBA 16 are prevented from inadvertently acting as fuses in the presence of the electric field $\vec{E}$, thereby avoiding prematurely firing or triggering some action via the PCBA 16, such as an activation of the EID 19.

In the example system 10 shown in FIG. 1, the cavity 15 allows space for the PCBA 16 to be inserted in the housing 12 along with other necessary components, e.g., the power supply 18 and the EID 19. However, the same cavity 15 may serve to impinge energy from the electric field $\vec{E}$. Various cavity modes may result from this effect. Common cavity modes include coupling and cross-coupling, and thus traces of the PCBA 16 could pick up energy from the electric field $\vec{E}$ or from energy trapped in the cavity 15, e.g., energy entering any external openings or passages of the housing 12.

Referring to FIG. 2, an example embodiment of the PCBA 16 of FIG. 1 is shown in a schematic cross-sectional view. The thickness or z-dimension of the PCBA 16 is formed from a laminated stack-up of layers 20, 30, 40, and 50, i.e., TCL(s) 20, conductive layer(s) 30, dielectric layer(s) 40, and pre-pregnated layer(s) 50. The PCBA 16 in all embodiments includes at least one conductive layer 30, such as thin foil sheet of copper or another suitable conductor.

Three conductive layers 30 are shown in the non-limiting example embodiment of FIG. 2, with a pair of the conductive layers 30 acting as outer layers of the PCBA 16 with outermost surfaces 35. Two dielectric layers 40 are shown in the same example embodiment, with the conductive outer layers 30 positioned adjacent to a corresponding one of the dielectric layers 40. The pre-pregnated layer 50 may be disposed between one of the conductive layers 30 and one of the dielectric layers 40.

Suitable materials for the dielectric layers 40 include epoxy-resin fiberglass or a glass-reinforced epoxy laminate, e.g., FR-4, or any other application-suitable material. The pre-pregnated layer 50 may be formed as an uncured resin-treated glass or ceramic sufficient for filling any gaps or spacing between the outer layers, i.e., conductive layers 30 having the outermost surfaces 35. Use of the pre-pregnated layer(s) 50 may help to bond the various layers 20, 30, and 40 together, and also providing additional structural integrity for the PCBA 16.

While the layers 20, 30, and 40 are shown with uniform distribution in FIG. 2 for illustrative clarity, the TCL 20 in an actual application will ordinarily have a variable geometry with respect to at least one of the thickness (z-dimension), width (x-direction), and length (y-direction) of the PCBA 16. An example of this variable geometry is shown via narrowed portion 21 in FIG. 2, which indicates z-dimension or thickness variation. A PCBA portion 16A is shown in the schematic plan view of FIG. 2A to show geometric variation with respect to the width/x-dimension and length/y-dimension of the PCBA 16 of FIG. 2. In FIG. 2A, the first four layers 30, 40, 50, and 30 of FIG. 2 are removed for illustrative clarity.

Referring to FIG. 3, an example method 100 is shown that explains a process for designing and manufacturing a PCBA such as the PCBA 16 of FIG. 2 for use as an EMI broadband filter using the trans-conductor properties of the TCL 20 described above. The method 100 begins with step 102, wherein characteristics of the electric field $\vec{E}$ are identified. Step 102 entails determining the type and intensity of the electric field $\vec{E}$, e.g., the far field, near far field, and near reactive field, as well as the polarization of these fields. Step 102 also includes determining the band of frequencies of exposure, whether broad, narrow, pulsed, or continuous.

After this step is complete, the components of the PCBA 16 are identified that are susceptible to the identified properties of the electric field $\vec{E}$. These components of the conductive layer 30 are referred to hereinafter as the pre-determined protected components or areas. Example components or areas can include traces, embedded vias, through vias, connectors, ribbon cable, wires, and the like. The method 100 proceeds to steps 104 and 106 when all of this is completed.

At step 104, the method 100 includes determining the depth of penetration (DOP) of the expected portions of the electric field $\vec{E}$ into the identified predetermined protected components from step 102, e.g., via direct measurement, modeling, or theoretical calculation. The end goal of step 104 is to determine the thickness of the TCL 20, which should be sufficient for conducting the required electrical current from the electric field $\vec{E}$ having a predetermined current density J. The method 100 then proceeds to step 108.

Step 106, which is performed in tandem with step 104, includes determining the maximum allowable resistance ($R_{MAX}$) of the circuit trace being formed by the TCL 20. The circuit embodied as the PCBA 16 has an overall maximum resistance for implementation of the desired application, including control of the EID 19 of FIG. 1. The sheet resistance of the TCL 20 can be used to calculate the effective added impedance of the TCL 20 to the overall PCBA 16. The location of placement of the TCL 20 is also determined as part of step 106 using this information, with the electrical current I with the predetermined current density J directed around any protected components as noted above. The method 100 then proceeds to step 108.

Step 108 entails determining the power loss ($P_{LOSS}$) in the PCBA 16. Step 108 may entail solving the following equation:

$$P_{Loss} = 2\left(\frac{R_S}{2}\right)\int_{x=0}^{\infty} J_S^2 dx$$

where $R_S$ is the sheet resistance and $J_S$ is the current density of the current flowing the TCL 20. The impressed and conducted current densities are also determined, with impressed current being the current due to radiation from the electric field $\vec{E}$ and the conducted current being the current due to any adjacent sources. The required maximum attenuation for controlling the current density J resulting from the electric field $\vec{E}$ is ultimately determined as part of step 108. As the TCL 20 is not purely a capacitor, nor is it purely an inductor or a resistor, the embedded TCL 20 will change its impedance in the presence of the electric field $\vec{E}$. That is, the TCL 20 will react over a very broad band range of frequencies with variable attenuation. The method 100 proceeds to step 110 once the power loss and maximum attenuation have been determined.

Step 110 includes defining the shape of the TCL 20. This includes defining the length, width, and thickness of the TCL 20. For commercially available sheets of NiP, for example, market standard sheet resistance $R_S$ is 10, 25, and 250 Ohms/meter, with various sheet thicknesses. For any of the suitable nickel-metal based materials used for construction of the TCL 20, as the magnetic field increases the nickel will contract. Although the nickel contracts, there is more phosphorus, in the example of NiP, so the surface roughness of the TCL 20 will change with the contraction. This in turn changes the capacitance and changes the effective permittivity of the dielectric material located adjacent to the TCL 20, for instance the dielectric layer 40 shown at that location in FIG. 2. Although the TCL 20 is not a pure resistor, the TCL 20 has various resistance values under varying electric fields, effective wavelengths, and penetration depths. The method 100 proceeds to step 112 after the shape of the TCL 20 has been defined.

Step 112 includes constructing the TCL 20 with the determined shape from step 110. Constructing the TCL 20 with the desired shape may take place with the fabrication of the PCBA 16, including positioning the TCL 20 with the determined thickness and shape adjacent to the dielectric layer 40 and the protected areas of the conductive layer 30 to form the PCBA 16. The PCBA 16 thereafter can be installed in a system, such as the system 10 shown in FIG. 1, and used in the control of the EID 19.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the spirit and scope of the disclosure as defined in the appended claims. Moreover, the present concepts expressly include any and all combinations and subcombinations of the preceding elements and features.

What is claimed:

1. A printed circuit board assembly (PCBA) for controlling an electrically-initiated device (EID) positioned externally with respect to the PCBA and exposed to a broadband electric field, the PCBA comprising:
    a plurality of conductive layers configured to electrically connect to the EID, the plurality of conductive layers including at least one conductive layer in which an electrical current with a current density is impressed by the broadband electric field falling incident upon the at least one conductive layer;
    a dielectric layer interposed between the plurality of conductive layers to form a stack-up;
    a via connecting the plurality of conductive layers; and
    a trans-conductor layer (TCL) embedded between one of the conductive layers and the dielectric layer, the TCL including a nickel-metal composite metamaterial and having a variable geometry along a width and a length of the TCL, the TCL being configured to change shape, size, surface roughness and/or characteristic impedance in the presence of the broadband electric field to thereby redirect the impressed electrical current away from the conductive layers and into the dielectric layer,
    wherein the dielectric layer includes a material configured as a dielectric waveguide that redirects field energy of the electrical current to an end of the PCBA and into the via, the via being configured to radiate the field energy away from the EID.

2. The PCBA of claim 1, wherein the PCBA is characterized by an absence of an electromagnetic interface shield and a Faraday cage surface mounted to the PCBA.

3. The PCBA of claim 1, wherein the nickel-metal composite metamaterial of the TCL includes a nickel-phosphorus (NiP) metamaterial.

4. The PCBA of claim 1, wherein the nickel-metal composite metamaterial of the TCL includes a nickel-chromium (NiCr) metamaterial.

5. The PCBA of claim 1, wherein a nickel content of the nickel-metal composite metamaterial is between about 10% and about 45% by weight of the TCL.

6. The PCBA of claim 1, further comprising a plurality of circuit components surface mounted to one or more of the conductive layers.

7. The PCBA of claim 1, wherein the TCL includes a plurality of discrete TCL segments disposed on the dielectric layer and spaced from each other.

8. The PCBA of claim 7, wherein a first one of the discrete TCL segments has a first irregular shape, and a second one of the discrete TCL segments has a second irregular shape distinct from the first irregular shape.

9. The PCBA of claim 7, wherein a first one of the discrete TCL segments has a first surface area, and a second one of the discrete TCL segments has a second surface area distinct from the first surface area.

10. The PCBA of claim 1, further comprising a pre-pregnated layer adjacent the dielectric layer and sandwiched between the conductive layers.

11. The PCBA of claim 10, wherein the pre-pregnated layer includes an uncured resin-treated glass or ceramic material.

12. The PCBA of claim 1, wherein each of the conductive layers includes a metallic foil sheet.

13. The PCBA of claim 1, wherein the dielectric layer includes an epoxy-resin fiberglass or a glass-reinforced epoxy laminate.

14. The PCBA of claim 1, wherein first and second ones of the conductive layers define outermost layers of the PCBA, and wherein the via extends between and physically connects the first and second ones of the conductive layers.

15. The PCBA of claim 14, wherein the dielectric layer includes a first dielectric layer attached to an inside surface of the first one of the conductive layers, and a second dielectric layer attached to an inside surface of the second one of the conductive layers, the PCBA further including a pre-pregnated layer disposed between the first one and a third one of the conductive layers, and wherein the TCL is disposed between the second dielectric layer and the third one of the conductive layers.

16. A sonobuoy system for use in a body of water exposed to an externally-generated resonant broadband electric field, the sonobuoy system comprising:
    a sonobuoy housing defining an internal cavity;
    a power supply disposed in the internal cavity of the sonobuoy housing;
    an electrically-initiated device (EID) disposed in the internal cavity of the sonobuoy housing and electrically connected to the power supply, the EID being configured to activate via an electrical signal; and
    a printed circuit board assembly (PCBA) disposed in the internal cavity of the sonobuoy housing and electrically connected to the EID and the power supply, the PCBA including:
        a plurality of conductive layers including at least one conductive layer in which an electrical current with a current density is impressed by the broadband electric field falling incident upon the at least one conductive layer;
        a plurality of dielectric layer interposed between the plurality of conductive layers to form a stack-up;
        a plurality of vias connecting the plurality of conductive layers; and
        a trans-conductor layer (TCL) embedded between one of the conductive layers and one of the dielectric layers, the TCL including a nickel-metal composite metamaterial and having a variable geometry along a width and a length of the TCL, the TCL being configured to change shape, size, surface roughness and/or characteristic impedance in the presence of the broadband electric field to thereby redirect the impressed electrical current away from the conductive layers and into at least one of the dielectric layers, wherein the at least one of the dielectric layers includes a material configured as a dielectric waveguide that redirects field energy of the electrical current to at least one end of the PCBA and into at least one of the vias, the at least one of the vias being configured to radiate the field energy away from the EID.

17. The sonobuoy system of claim 16, wherein the PCBA is characterized by an absence of an electromagnetic interface shield and a Faraday cage surface mounted to the PCBA.

18. The sonobuoy system of claim 16, wherein the nickel-metal composite metamaterial of the TCL includes a nickel-phosphorus (NiP) metamaterial or a nickel-chromium (NiCr) metamaterial.

19. The sonobuoy system of claim 16, further comprising a plurality of circuit components surface mounted to one or more of the conductive layers.

20. The sonobuoy system of claim 16, wherein the TCL includes a plurality of discrete TCL segments disposed on the dielectric layer and spaced from each other.

* * * * *